United States Patent [19]

Koh

[11] Patent Number: 5,696,717
[45] Date of Patent: Dec. 9, 1997

[54] NONVOLATILE INTEGRATED CIRCUIT MEMORY DEVICES HAVING ADJUSTABLE ERASE/PROGRAM THRESHOLD VOLTAGE VERIFICATION CAPABILITY

[75] Inventor: Yong-Nam Koh, Kyungki-do, Rep. of Korea

[73] Assignee: Samsung Electronics Co., Ltd., Suwon, Rep. of Korea

[21] Appl. No.: 730,415

[22] Filed: Oct. 15, 1996

[30] Foreign Application Priority Data

Oct. 16, 1995 [KR] Rep. of Korea ............... 95-35659

[51] Int. Cl.$^6$ ............................................. G11C 16/06
[52] U.S. Cl. ............................. 365/185.22; 365/185.12; 365/185.17; 365/185.23
[58] Field of Search ................. 365/185.22, 185.12, 365/185.17, 185.23

[56] References Cited

U.S. PATENT DOCUMENTS

| | | | |
|---|---|---|---|
| 5,109,361 | 4/1992 | Yim et al. | 365/218 |
| 5,214,605 | 5/1993 | Lim et al. | 365/218 |
| 5,299,162 | 3/1994 | Kim et al. | 365/201 |
| 5,299,166 | 3/1994 | Suh et al. | 365/218 |
| 5,414,664 | 5/1995 | Lin et al. | 365/218 |
| 5,511,022 | 4/1996 | Yim et al. | 365/185.17 |
| 5,544,116 | 8/1996 | Chao et al. | 365/210 |
| 5,546,341 | 8/1996 | Suh et al. | 365/185.33 |
| 5,617,353 | 4/1997 | Lim et al. | 365/185.17 |

OTHER PUBLICATIONS

B. Prince et al., *Semiconductor Memories, A Handbook of Design, Manufacture, and Application*, Second Edition, John Wiley & Sons Ltd., pp. 603–604 (1991).

Ashok K. Sharma, *Semiconductor Memories Technology, Testing, and Reliability*, IEEE Press Marketing, Institute of Electrical and Electronics Engineers, Inc., 1997, pp. 122–139.

Kynett et al., *An In-System Reprogrammable 32KX8 CMOS Flash Memory*, IEEE Journal of Solid-State Circuits, vol. 23, No. 5, Oct. 1988, pp. 1157–1163.

*Primary Examiner*—David C. Nelms
*Assistant Examiner*—Andrew Q. Tran
*Attorney, Agent, or Firm*—Myers, Bigel, Sibley & Sajovec

[57] ABSTRACT

Integrated circuit memory devices include an array of NAND strings containing a plurality of EEPROM memory cells, sense amplifiers for determining whether the memory cells have been properly erased and programmed during respective erase and program verification modes of operation, an erase voltage adjusting circuit for setting a limit on a range of acceptable erase threshold voltages and a program voltage adjusting circuit for setting a limit on a range of acceptable program threshold voltages. The sense amplifier determines during an erase verification operation whether a memory cell in a NAND string has been erased to have a threshold voltage within a range of acceptable erase threshold voltages. The range of acceptable erase threshold voltages typically has an upper limit less than a predetermined reference potential (e.g., GND). For example, the sense amplifiers can be utilized to determine whether the memory cells in the string have been sufficiently erased so that their erase threshold voltages ($EV_{th}$) are less than or equal to a preselected erase threshold voltage (e.g., −1 Volt). An erase voltage adjusting circuit is also provided for setting a limit on a range of acceptable erase threshold voltages by modifying an effective series resistance of the string of memory cells as seen by the sense amplifier during the erase verification operation. Here, the erase voltage adjusting circuit sets a limit by making the erase threshold voltage of a selected cell in the string appear to be too high when evaluated by the sense amplifier. This prompts a repeat erase operation to lower the threshold voltage of the selected cell.

8 Claims, 6 Drawing Sheets

NONVOLATILE INTEGRATED CIRCUIT MEMORY DEVICES HAVING ADJUSTABLE ERASE/PROGRAM THRESHOLD VOLTAGE VERIFICATION CAPABILITY

FIELD OF THE INVENTION

The present invention relates to integrated circuit memory devices, and more particularly to integrated circuit memory devices having nonvolatile program and erase states.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., P-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Operation of a flash EEPROM device is typically divided into three modes including programming, erasing and reading.

Programming of a flash EEPROM device is typically achieved by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V_{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$).

In this state, known as the programmed state, the EEPROM device may be said to be storing a logic 0. Once programmed, the EEPROM device retains its higher threshold voltage even when its power supply is interrupted or turned off for long periods of time.

Reading of the EEPROM device is achieved by applying a predetermined read voltage ($V_{read}$) to the control gate, typically via a word line connecting a row of identical EEPROM devices or "cells", and applying a positive bias to the drain region, typically via a bit line connecting a column of identical EEPROM cells. If the EEPROM device is programmed, it will not conduct drain current ($I_{ds}$). However, if the EEPROM device has not been programmed (or has been erased), it will heavily conduct. In this state, the EEPROM device may be said to be storing a logic 1. Thus, by monitoring the bit line current, the programmed state (i.e., 1 or 0) of the EEPROM device can be determined.

Erasing of the EEPROM device may also be achieved by removing the stored charge from the floating gate. The erasure process can be achieved, for example, by grounding the control gate and applying a positive bias to the substrate (e.g., 10-20 Volts). Accordingly, flash EEPROM devices typically require bulk erasure of large portions of an array of cells since the effects of applying a large substrate bias typically cannot be confined to a single EEPROM cell.

As will be understood by those skilled in the art, a flash EEPROM integrated circuit memory device may contain a column-by-column array of NAND EEPROM cells having the general construction illustrated in cross-section and schematically by FIGS. 11.58 and 11.59 from a handbook by B. Prince et al. entitled *Semiconductor Memories*, John Wiley & Sons Ltd., pp. 603–604 (1991); and in an article by M. Momodomi et al. entitled *An Experimental 4-Mbit CMOS EEPROM with an NAND Structured Cell*, IEEE Journal of Solid State Circuits, Vol. 24, No. 5, p. 1238 October (1989). The operation of memory devices containing NAND EEPROM cells therein is also more fully described in commonly assigned U.S. Pat. Nos. 5,546,341 and 5,473,563 to Suh et al. entitled *Nonvolatile Semiconductor Memory*, and in commonly assigned application Ser. No. 08/716,022, entitled *Methods of Programming Flash EEPROM Integrated Circuit Memory Devices To Prevent Inadvertent Programming of Nondesignated NAND Memory Cells Therein*, filed Sep. 19, 1996 (Attorney Docket No. 5649-115), the disclosures of which are hereby incorporated herein by reference.

As will be understood by those skilled in the art, a conventional NAND-type flash memory cell may have a positive threshold voltage of about 1.5 Volts when programmed and a negative threshold voltage of about −3 Volts when erased. However, such conventional NAND-type flash memory cells are prone to have an excessively lowered threshold voltage (hereinafter referred to as $V_{th}$) in an erased cell after an erase operation has been performed. One of the problems associated with an over-erased cell having a $V_{th}$ below about −3 Volts, for example, is the excessively low turn-on resistance of the cell when serving as a pass transistor during reading and program verification modes of operation. An over-programmed cell having a $V_{th}$ of about 3 Volts also provides excessively high turn-on resistance when serving as a pass transistor. Such conditions can adversely impact the reliability of program verification operations performed on a selected cell. This is due at least in part because the threshold voltage of a selected cell can be a strong function of the threshold voltages of the pass transistors. For example, as illustrated by FIG. 6, assuming that the pass transistors having the same threshold voltage ($V_{th}$) and five (5) Volts is applied to the gates of the pass transistors during program verification or during reading, a 0.7 Volt difference in threshold voltage of the selected cell may result for the cases with $V_{th}$ of the pass transistors being respectively −3 Volts (B) and 3 Volts (A1). This can cause operational errors in prior art multi-bit memory cells having a low $V_{th}$ distribution which is less than about 1 Volt. In addition, such conventional NAND-type flash memory employ a self-boosting mechanism in order to prevent the data of nonselected cells in a NAND string from being affected by the program voltage $V_{pgm}$ applied to a word line W/L of a selected cell during programming. However, since the $V_{th}$ of the non-selected cells in the string can be excessively negative, the program voltage lowers the programming preventative voltage induced in the channel of the nonselected cells.

Referring to FIG. 1 for illustrating a cross-sectional view of the conventional memory cells and an equivalent circuit thereof, the cell comprises a semiconductor substrate 1, well region 2, drain/source region 3, floating gate 4 formed over the semiconductor substrate 1 with an insulating layer therebetween, and control gate 5 formed over the floating gate 4 with an insulating layer therebetween. It is assumed that the voltage increase induced in the channel of the memory cell by $V_{pgm}$ is $V_a$, the voltage increase induced by the pass voltage $V_{pass}$ applied to the gate of a nonselected memory cell in programming is $V_b$, the final $V_{th}$ is −3 Volts when erased using conventional steps. During programming, the channel voltage is initially induced as $V_{cc}-V_{th}$, then increased by $V_b$ by $V_{pass}$ and then additionally by $V_a$ by $V_{pgm}$. However, the nonselected memory cell has a $V_{th}$ of −3 Volts and the channels of all cells are formed to divide the channel voltage, and therefore the memory cell being programmed has a channel voltage of $(V_{cc}-V_{th})+V_b$. This accounts for the problem that the lowered $V_{pass}$ degrades the program disturbance preventative characteristics. As shown by the sequence of prior art steps of FIG. 2, an erase verification operation begins at the end of the erasing operation and shifts to the main programming step if the $V_{th}$ of the memory cell is less than zero Volts.

Thus, notwithstanding the above described integrated circuit memory devices, there continues to be a need for memory devices with improved programming and erasing capabilities.

SUMMARY OF THE INVENTION

It is therefore an object of the present invention to provide improved integrated circuit memory devices and methods of programming same.

It is another object of the present invention to provide integrated circuit memory devices having built-in programming and erase verification capability and methods of programming same.

It is still another object of the present invention to provide integrated circuit EEPROM memory devices having adjustable programming and erase threshold voltage verification capability and methods of programming same.

These and other objects, features and advantages of the present invention are provided by integrated circuit memory devices containing an array of memory cells, sense amplification means for determining whether the memory Cells have been properly erased and programmed during respective erase and program verification modes of operation, erase voltage adjusting means for setting a limit on a range of acceptable erase threshold voltages and program voltage adjusting means for setting a limit on a range of acceptable program threshold voltages.

In particular, integrated circuit memory devices according to the present invention preferably contain sense amplification means connected to a string of memory cells for determining during an erase verification operation whether a memory cell in the first string has been erased to have a threshold voltage within a range of acceptable erase threshold voltages. The range of acceptable erase threshold voltages typically has an upper limit less than a predetermined potential (e.g., GND). For example, in the case of a NAND string of EEPROM memory cells, sense amplification means can be utilized to determine whether the memory cells in the string have been sufficiently erased so that their erase threshold voltages ($EV_{th}$) are less than or equal to a preselected erase threshold voltage (e.g., −1 Volt). Erase voltage adjusting means is also provided for setting a limit on a range of acceptable erase threshold voltages by modifying an effective series resistance of the string of memory cells as seen by the sense amplification means during the erase verification operation. Here, the erase voltage adjusting means can set a limit by making the erase threshold voltage of a selected cell in the string appear to be too high when evaluated by the sense amplification means, to thereby prompt a repeat erase operation to lower the threshold voltage of the selected cell.

The sense amplification means also preferably contains means for determining during a program verification operation whether a memory cell in the string has been programmed to have a threshold voltage within a range of acceptable program threshold voltages. This range typically has a lower limit greater than a predetermined reference potential (e.g., GND). For example, in the case of a NAND string of EEPROM memory cells, sense amplification means can be utilized to determine whether memory cells in the string have been sufficiently programmed so that their program threshold voltage ($PV_{th}$) is greater than or equal to a preselected program threshold voltage (e.g., 1 Volt). Here, program voltage adjusting means is provided for setting a limit on a range of acceptable program threshold voltages by modifying an actual series resistance of the string as seen by the sense amplification means during the program verification operation. The program voltage adjusting means can set a limit by making the program threshold voltage of a selected cell in the string appear to be too low when evaluated by the sense amplification means, to thereby prompt a repeat program operation to increase the threshold voltage of the selected transistor.

The present invention also provides methods of verifying the erase or program states of EEPROM cells in a NAND string by erasing at least one EEPROM cell in the NAND string and then verifying the erasing step by determining whether an erase threshold voltage of the at least one EEPROM cell is within a first range of acceptable threshold voltages. This verify step is performed using a sense amplifier to determine a series resistance of the NAND string as modified by a pull-down transistor electrically coupled in series with the NAND string. These steps are then repeated, if necessary, until the erase threshold voltage of the at least one EEPROM cell is within the first range of acceptable threshold voltages. In addition, the at least one EEPROM cell may also be programmed. This programming step is then followed by a step to verify whether the program threshold voltage of the at least one EEPROM cell is within a second range of acceptable threshold voltages which is outside the first range of acceptable voltages. These programming and verification steps are then repeated, if necessary, until the program threshold voltage of the at least one EEPROM cell is within the second range of acceptable threshold voltages.

DESCRIPTION OF PREFERRED EMBODIMENTS

Figure 1:
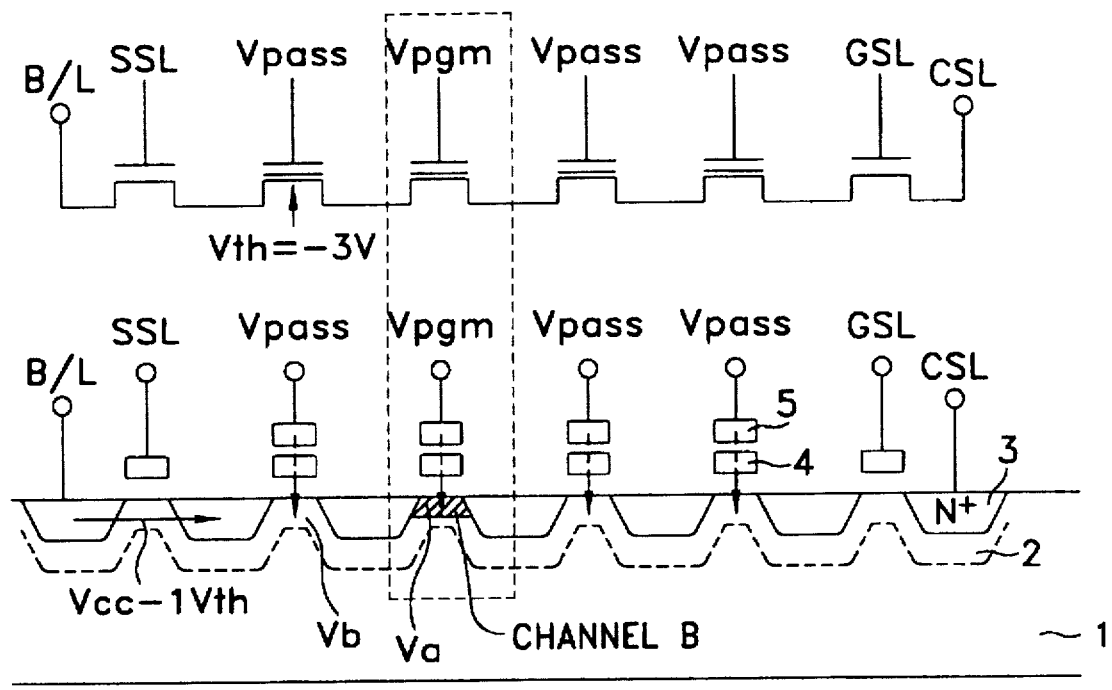
FIG. 1 illustrates a schematic and cross-sectional representation of a NAND memory device containing EEPROM memory cells therein, according to the prior art.
Figure 2:
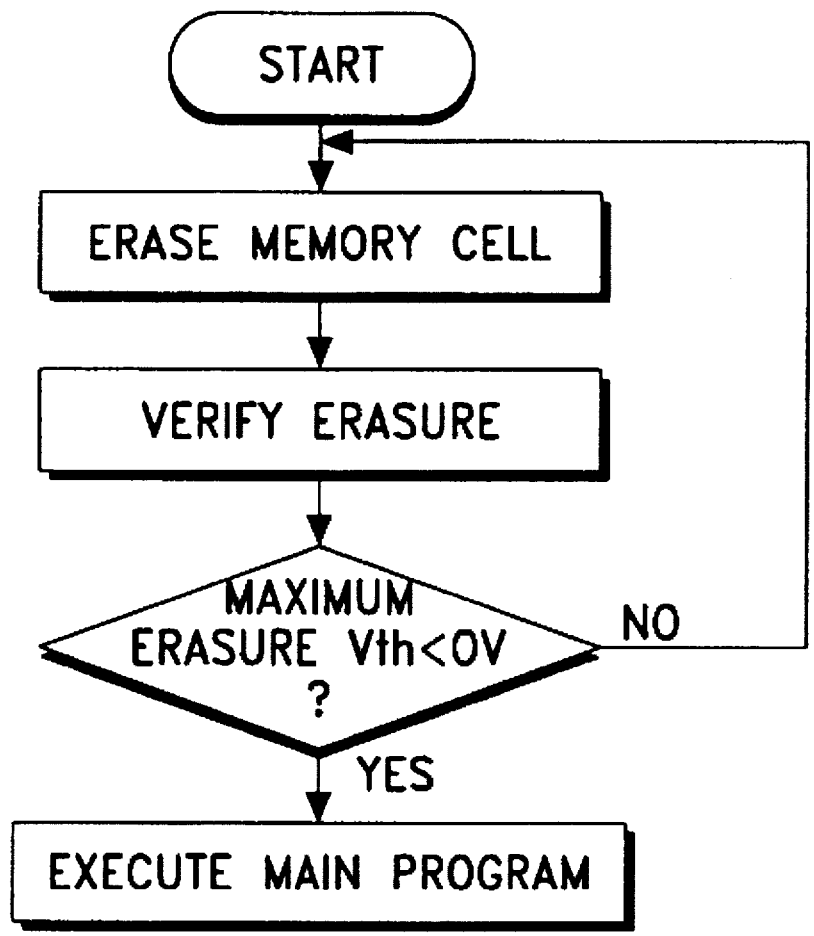
FIG. 2 illustrates steps of performing erase verification operation for an integrated circuit memory device, according to the prior art.
Figure 3:
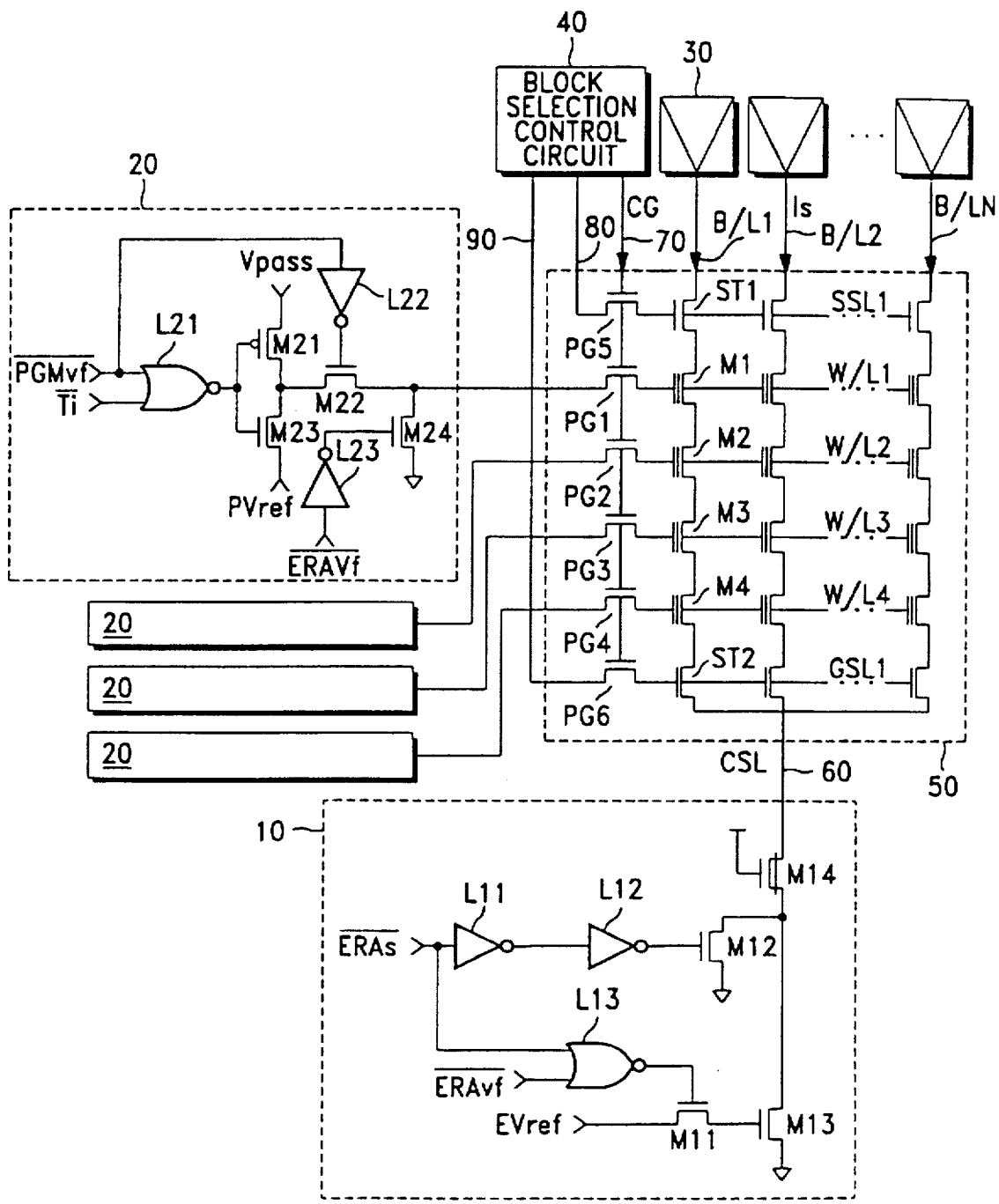
FIG. 3 illustrates an electrical schematic of an integrated circuit memory device according to one embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring now to FIGS. 3–7, a preferred embodiment of a nonvolatile integrated circuit memory device according to the present invention will be described. As illustrated best by FIG. 3, a preferred integrated circuit memory device comprises an array 50 of NAND memory strings electrically coupled to a respective plurality of sense amplifiers 30 by a plurality of bit lines (B/L1–B/LN). The NAND memory strings are illustrated as each comprising a column or string of EEPROM memory cells (M1–M4). As will be understood by those skilled in the art, the first, second, third and fourth memory cells M1–M4 in the NAND strings collectively form respective first, second, third and fourth pages (or rows) of memory cells interconnected by respective word lines W/L1–W/L4, as illustrated. Preferably, the NAND strings are electrically coupled in series at a first end thereof to respective bit lines by a plurality of first select transistors ST1.

As illustrated, these first select transistors ST1 are responsive to application of a signal to a string select signal line (SSL1). The string select signal line SSL1 is connected to the insulated gate electrodes of the first select transistors ST1. At a second end, the EEPROM memory cells (M1–M4) in each string are electrically coupled to a common source signal line 60 (CSL) by respective second select transistors ST2. These second select transistors ST2 are responsive to application of a signal to a ground select signal line (GSL1). The array 50 of memory cells is also coupled to an external block selection control circuit 40 of conventional design by control signal lines 70, 80 and 90. These control signal lines drive the gate signal line (CG) of a plurality of pass transistors PG1–PG6, the drain of the fifth pass transistor PG5 and the drain of the sixth pass transistor PG6. As explained more fully hereinbelow, the drains of the first, second, third and fourth pass transistors PG1–PG4 are electrically coupled to a plurality of program voltage adjusting means 20, as described more fully hereinbelow.

Erase voltage adjusting means 10 is also provided for setting a limit on a range of acceptable erase threshold voltages $EV_{th}$, such as an upper limit above which an "erased" cell is not considered satisfactorily erased. The erase voltage adjusting means 10 sets the upper limit by modifying an effective series resistance of a NAND string as seen by a respective sense amplifier 30. In particular, the effective series resistance of a NAND string (having a selected memory cell (e.g., M1) undergoing erase verification) can be modified by turning off a first pull-down transistor M12 and adjusting the channel resistance of a second pull-down transistor M13 to an intermediate value which is an inverse function of the magnitude of an erase verification reference signal EVref. The effective series resistance of a NAND string can be modified by holding the $\overline{ERAs}$ signal line at a logic 0 potential, switching the $\overline{ERAvf}$ signal line from logic 1→0 at commencement of a first time interval T1, and adjusting the erase verification reference signal EVref to an intermediate potential depending on the desired erase threshold voltage $EV_{th}$ to be achieved. This combination of signals holds the output of a first inverter L11 at a logic 1 potential, holds the output of a second inverter L12 at a logic 0 potential (to maintain the first pull-down transistor M12 in an off state) and switches the output of the first NOR gate L13 from logic 0→1 to turn-on the pass transistor M11 and pass the erase verification reference signal EVref to the gate of the second pull-down transistor M13. Thus, the common source signal line 60 (CSL) is not maintained at the reference potential (e.g., GND), but is elevated by an amount equal to the product of the current therein and the sum of the channel resistances of the normally-on depletion mode transistor M14 and second pull-down transistor M13 (i.e., $V_{CSL}=I_{CSL}(R_{M13}+R_{M14})$.

Accordingly, by turning on the pass transistors PG1–PG6 hard by applying a large potential to the common gate signal line CG, by setting the word line W/L1 of a selected memory cell (e.g., M1) at a logic 0 reference potential (e.g., GND) and by setting the remaining word lines W/L2–W/L4 and string and ground select signal lines SSL1 and GSL1 at relatively high pass potentials (e.g., $V_{pass}=10$ Volts), the threshold voltage of the selected memory cell can be determined. This is achieved by using the sense amplifier 30 to monitor the corresponding bit line B/L current and bit line B/L potential during an erase verification operation. However, in contrast to the prior art, the bit line potential does not equal the product of the bit line current and the combined series resistance of the select transistors ST1, ST2 and memory cells M1–M4. Instead, the bit line potential equals the product of the bit line current and the combined series resistance of the select transistors ST1, ST2, memory cells M1–M4, depletion mode transistor M14 and second pull-down transistor M13.

Thus, because the series resistance of the second pull-down transistor M13 can be adjusted upward by lowering the magnitude of the erase verification reference signal EVref, the "effective" series resistance of the selected memory cell (e.g., M1) can also be adjusted upward to reflect a higher "effective" erase threshold voltage $EV_{th}$. From the standpoint of the sense amplifier 30, a higher effective series resistance of the selected memory cell (e.g., M1) is interpreted (based on the bit line current and potential) as a higher erase threshold voltage $EV_{th}$ for that cell. This then triggers a repeat erase operation to lower the threshold voltage of the selected transistor. Accordingly, the magnitude of EVref can be preselected to precisely obtain a desired upper limit on the erase threshold voltage $EV_{th}$. For example, repeated short duration erase operations (e.g., single cell or block erase) can be performed, if necessary, until the erase threshold voltage $EV_{th}$ of the selected cell is reduced to an acceptable level. At this point, the actual channel resistance of the selected cell at the respective gate potential (e.g., 0 V)) will be small enough to compensate for the added resistance provided by the second pull-down transistor M13 (and depletion mode transistor M14). Thus, by lowering the magnitude of EVref, lower erase threshold voltages $EV_{th}$ limits can be achieved in a controlled manner.

Referring again to FIGS. 3 and 7, the operations for performing program verification will now be described more fully. In particular, program voltage adjusting means 20 is provided for setting a limit on the range of acceptable program threshold voltages $PV_{th}$ by modifying an actual series resistance of a NAND string as seen by a sense amplifier 30. As illustrated best during time interval T2 in FIG. 7, program verification is performed by maintaining the ERAvf signal line at a logic 1 potential so that the output of the turn-off inverter L23 is maintained at a logic 0 potential to turn off the pull-down transistor M24. The ERAs signal line is also switched from 0→1 to turn on the first pull-down transistor M12 and maintain the common source signal line 60 at essentially the reference potential (e.g., GND).

The PGMvf and Ti signal lines corresponding to the page containing the selected memory cell (e.g., M1) undergoing program verification are also switched from 1→0 to cause the output of the NOR gate L21 to switch to a logic 1 potential. This prevents the $V_{pass}$ signal from being transmitted through the P-type pass transistor M21 to the first pass transistor (e.g., PG1) within the array 50, but allows the PVref signal to pass through the N-type pass transistors M23 and M22 to the first pass transistor PG1 and to the first word line (e.g., W/L1). With respect to the unselected cells (e.g., M2–M4), the Ti signal line is switched low so that the $V_{pass}$ signal is passed through the P-type and N-type pass transistors M21 and M22 to the unselected word lines W/L2–W/L4. Accordingly, the magnitude of the program verification reference signal PVref can be increased until the selected memory cell has been programmed to the proper program threshold voltage $PV_{th}$. In other words, by increasing PVref, the channel resistance of the selected cell can be reduced to a relatively low level. The corresponding relatively high bit line current (and low bit line potential) is then interpreted by the sense amplifier 30 as being indicative of insufficient programming of the selected cell. Accordingly, the sense amplifier triggers an additional programming operation to raise the threshold voltage of the selected memory cell. These steps of programming and verifying are repeatedly performed, if necessary, until the program threshold voltage $PV_{th}$ of the selected cell is raised above a predetermined lower limit (e.g., 1 Volt).

Figure 4:
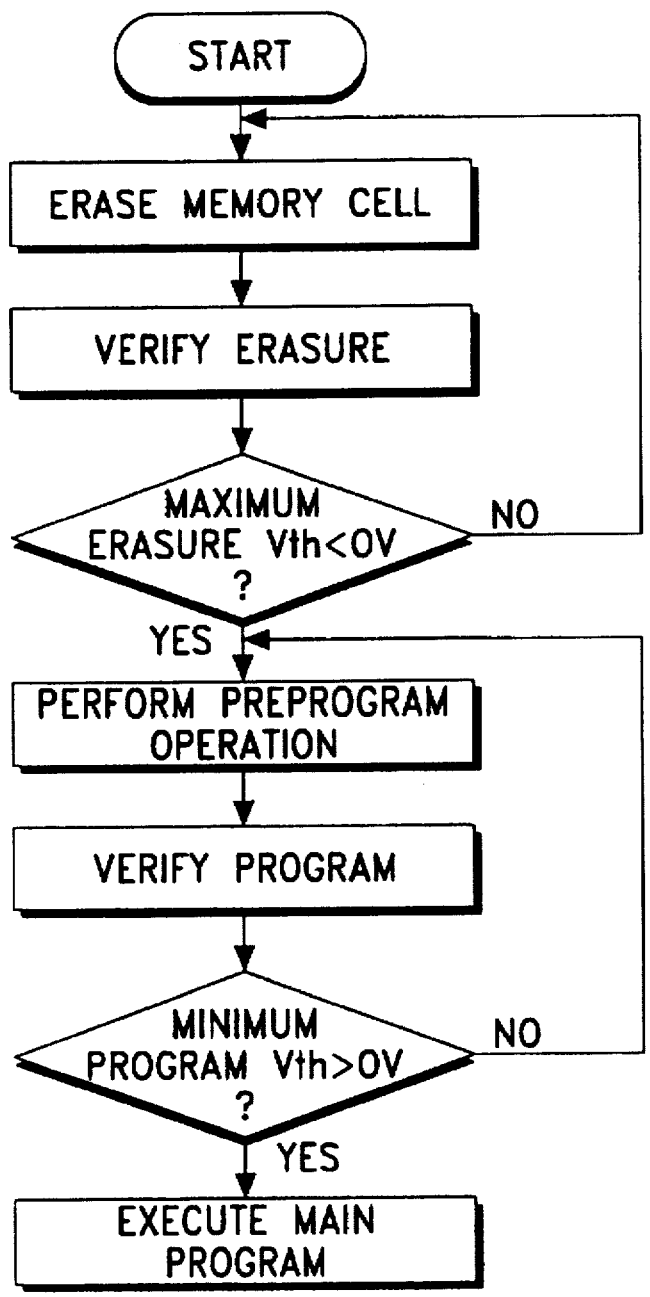
FIG. 4 illustrates steps of performing erase and program verification operation for the memory device of FIG. 3.
Figure 5:
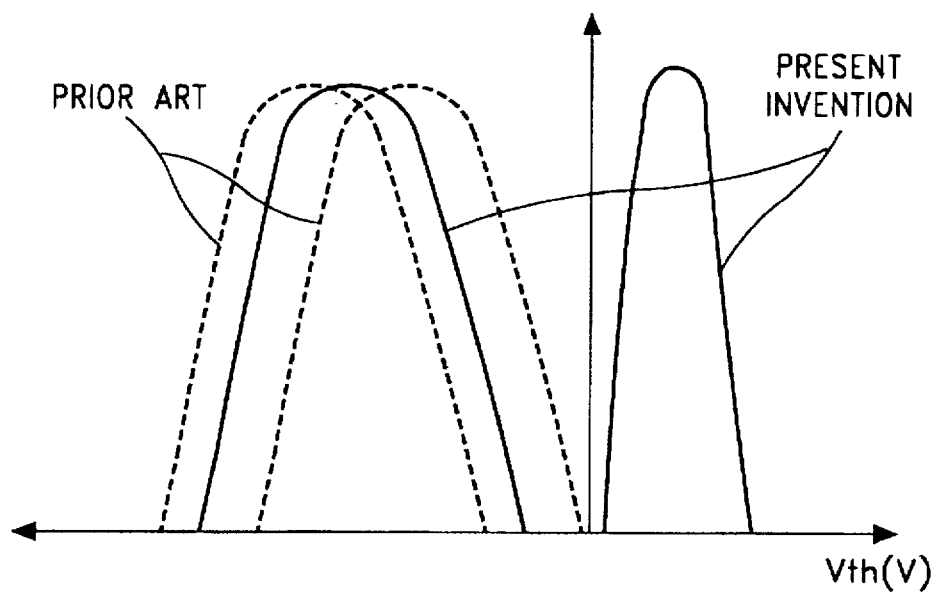
FIG. 5 is a graphical illustration comparing the distribution of erase and program threshold voltages obtainable in NAND EEPROM memory devices programmed according to the prior art and the methodology of FIG. 4.
Figure 6:
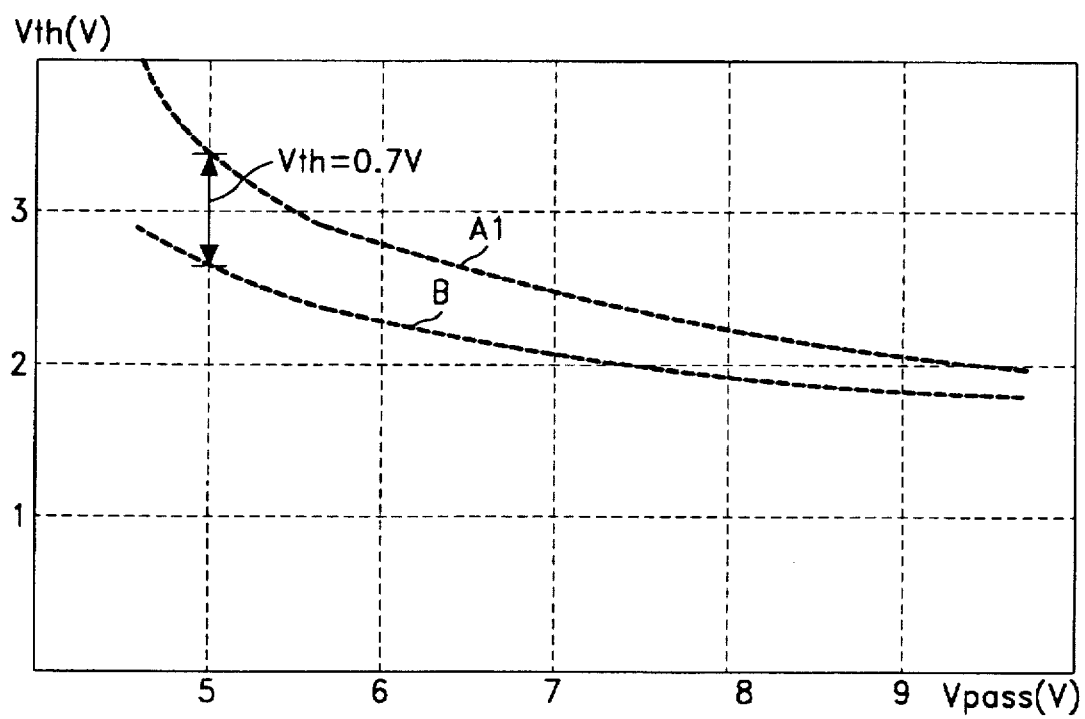
FIG. 6 is a graph illustrating the comparison of the threshold voltages sensed in program verification and data read, for a conventional non-volatile semiconductor memory.
Figure 7:
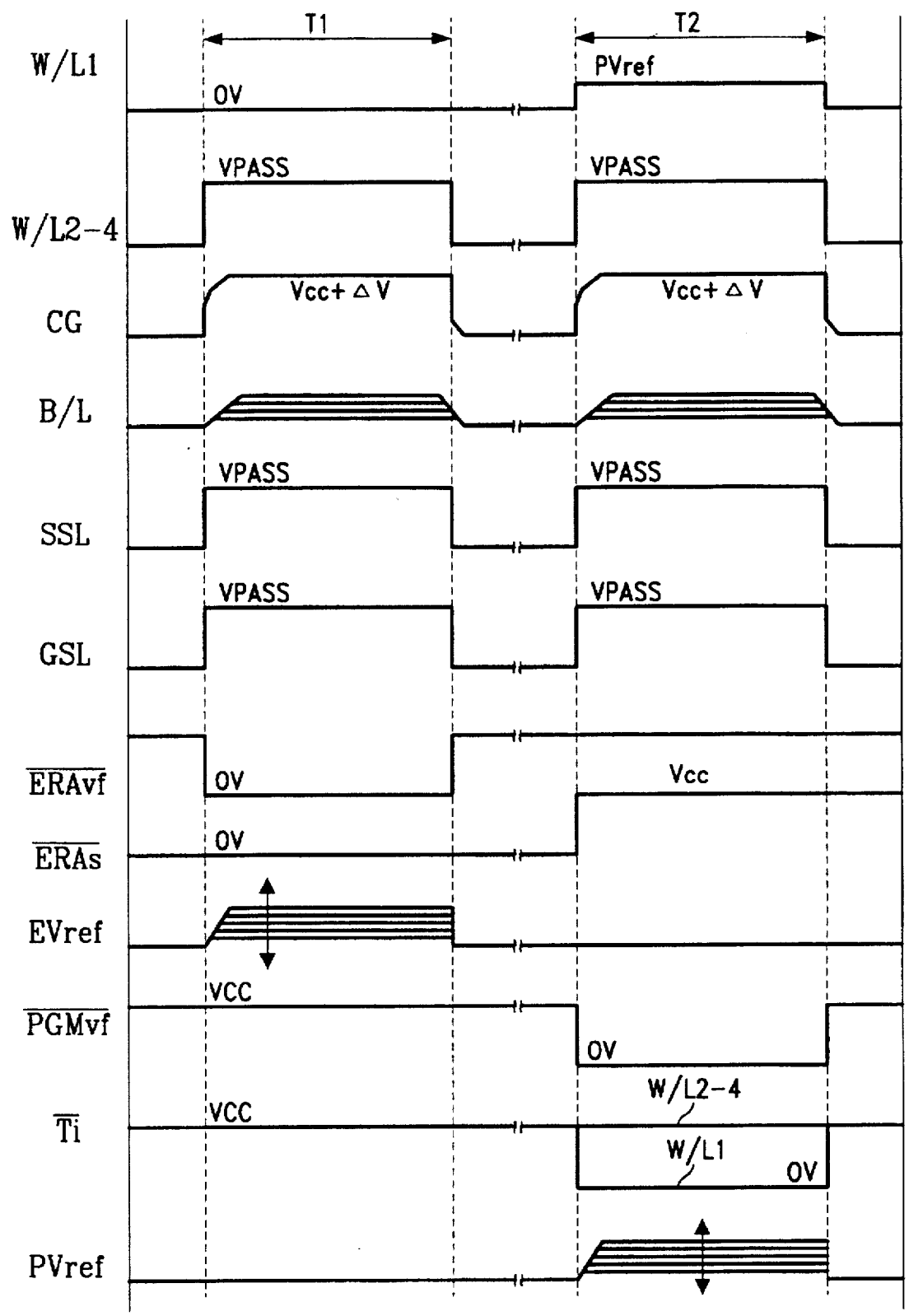
FIG. 7 is a diagram illustrating the timing of signals for performing erase and program verification operations according to the methodology of FIG. 4.

Thus, as illustrated best by FIG. 4, a preferred method of verifying a state of at least one EEPROM cell in a NAND string comprises the steps of erasing the at least one EEPROM cell in the NAND string and then verifying the previous erasing step by determining whether a threshold voltage of the at least one EEPROM cell is within a first range of acceptable threshold voltages (e.g., $EV_{th}$<0 Volts). This latter step is performed using a sense amplifier to determine a series resistance of the NAND string as modified by a pull-down transistor electrically coupled in series with the NAND string. If necessary, the selected transistor is erased again (or a block erase operation is performed) and then reverified. The method also comprises the steps of programming the at least one EEPROM cell and then verifying the programming step by determining whether the threshold voltage of the at least one EEPROM cell is within a second range of acceptable threshold voltages which is outside the first range of acceptable voltages (i.e., $PV_{th}$>0 Volts). If not, the programming and verification steps are repeatedly performed until the threshold voltage of the at least one EEPROM cell is within the range of acceptable program threshold voltages. It will be understood that there is a clear distinction between the threshold voltages of the erased and programmed memory cell as shown in FIG. 5.

In the drawings and specifications there have been disclosed typical preferred embodiments of the invention and, although specific terms are employed, they are used in a generic and descriptive sense only and not for purposes of limitation, the scope of the invention being set forth in the following claims.

That which is claimed is:

1. A nonvolatile integrated circuit memory device, comprising:

an array of memory cells arranged as a plurality of pages of memory cells electrically coupled to a respective plurality of word lines and a plurality of strings of memory cells electrically coupled at a first end thereof to a respective plurality of bit lines and at a second end thereof to a common source signal line via a plurality of first select transistors and a plurality of second select transistors, respectively;

sense amplification means, electrically connected to a first string of memory cells in the plurality thereof via a corresponding bit line and first select transistor, for determining during an erase verification operation whether a memory cell in the first string has been erased to have a threshold voltage within a first range of acceptable threshold voltages; and erase voltage adjusting means, electrically connected in series between the common source signal line and a reference signal line, for setting a limit on the first range of acceptable threshold voltages by modifying an effective series resistance of the first string as seen by said sense amplification means during the erase verification operation.

2. The memory device of claim 1, wherein said erase voltage adjusting means comprises:

first and second pull-down transistors electrically connected in parallel between the common source signal line and the reference signal line; and pull-down control means, electrically coupled to the first and second pull-down transistors, for disposing the first pull-down transistor in a nonconductive state and the second pull-down transistor in a conductive state during the erase verification operation.

3. The memory device of claim 2, wherein said pull-down control means comprises means, responsive to an erase verification reference potential, for disposing the second pull-down transistor in an intermediate conductive state.

4. The memory device of claim 3, wherein a magnitude of a channel resistance of the second pull-down transistor is a function of a magnitude of the erase verification reference potential.

5. The memory device of claim 1, wherein said sense amplification means comprises means for determining during a program verification operation whether the memory cell in the first string has been programmed to have a threshold voltage within a second range of acceptable threshold voltages which is outside the first range.

6. The memory device of claim 5, further comprising program voltage adjusting means, electrically coupled to a first page of memory cells which contains the memory cell of the first string, for setting a limit on the second range of acceptable threshold voltages by modifying an actual series resistance of the first string as seen by said sense amplification means during the program verification operation.

7. The memory device of claim 6, wherein an uppermost limit on the first range of acceptable threshold voltages is less than a lowermost limit on the second range of acceptable threshold voltages.

8. In a nonvolatile integrated circuit memory device containing an array of EEPROM memory cells therein arranged as a plurality of pages of EEPROM cells electrically coupled to a respective plurality of word lines and a plurality of NAND strings of EEPROM cells electrically coupled to a respective plurality of bit lines, a method of verifying a state of at least one EEPROM cell in a NAND string, comprising the steps of:

(a) erasing the at least one EEPROM cell in the NAND string;

(b) verifying said erasing step by determining whether a threshold voltage of the at least one EEPROM cell is within a first range of acceptable threshold voltages, using a sense amplifier to determine a series resistance of the NAND string as modified by a pull-down transistor electrically coupled in series with the NAND string;

repeating steps (a) and (b) in sequence until the threshold voltage of the at least one EEPROM cell is within the first range of acceptable threshold voltages;

(c) programming the at least one EEPROM cell;

(d) verifying said programming step by determining whether the threshold voltage of the at least one EEPROM cell is within a second range of acceptable threshold voltages which is outside the first range of acceptable voltages; and repeating steps (c) and (d) in sequence until the threshold voltage of the at least one EEPROM cell is within the second range of acceptable threshold voltages.

\* \* \* \* \*